United States Patent
Somasekhar et al.

(10) Patent No.: US 7,020,041 B2
(45) Date of Patent: Mar. 28, 2006

(54) METHOD AND APPARATUS TO CLAMP SRAM SUPPLY VOLTAGE

(75) Inventors: Dinesh Somasekhar, Portland, OR (US); Muhammad M. Khellah, Lake Oswego, OR (US); Yibin Ye, Portland, OR (US); Vivek K. De, Beaverton, OR (US); James W. Tschanz, Portland, OR (US); Stephen H. Tang, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 10/738,216

(22) Filed: Dec. 18, 2003

(65) Prior Publication Data

US 2005/0135162 A1      Jun. 23, 2005

(51) Int. Cl.
*G11C 7/00*      (2006.01)

(52) U.S. Cl. .................................. 365/229; 365/189.06

(58) Field of Classification Search ................ 365/229, 365/226, 228, 196
See application file for complete search history.

(56) References Cited

U.S. PATENT DOCUMENTS

| 5,325,338 | A | * | 6/1994 | Runaldue et al. ...... 365/230.05 |
| 5,345,424 | A | * | 9/1994 | Landgraf ..................... 365/227 |
| 6,434,076 | B1 | * | 8/2002 | Andersen et al. ........... 365/222 |
| 2003/0155962 | A1 | * | 8/2003 | Itoh et al. .................... 327/534 |

\* cited by examiner

*Primary Examiner*—Thong Q. Le
(74) *Attorney, Agent, or Firm*—Fleshner & Kim, LLP

(57) ABSTRACT

An apparatus and method are provided for limiting a drop of a supply voltage in an SRAM device to retain the state of the memory during an IDLE state. The apparatus may include a memory array, a sleep device, and a clamping circuit. The clamping circuit may be configured to activate the sleep device when a voltage drop across the memory array falls below a preset voltage and the memory array is in an IDLE state.

42 Claims, 5 Drawing Sheets

US 7,020,041 B2

METHOD AND APPARATUS TO CLAMP SRAM SUPPLY VOLTAGE

FIELD

Embodiments of the present invention relate to circuit design. More particularly, embodiments of the present invention relate to memory circuits such as static random access memories (SRAMs).

BACKGROUND

Power is a problem with most electronic systems and in particular with memory systems. The continued scaling of CMOS technology has caused standby power dissipation of static random access memories (SRAMs) to become an increasing problem. 6T SRAMs are considered one of the lowest power CMOS circuits and thus power loss is particularly important in these devices. Memory arrays implemented using SRAMs have very few cells active at any given time because READ/WRITE operations on a two-dimensional arrangement of memory cells typically enables one row at a time. Aggressive power management techniques can be employed by partitioning the memory into smaller banks of memory arrays and by collapsing the power supply of unselected memory arrays/rows. These techniques leverage the higher intrinsic stability of the SRAM cell when it is unselected.

The intrinsic stability of a SRAM cell corresponds to a noise-margin of a cross-coupled inverter loop of the cell when it is disconnected from the bit-lines. In contrast, the read stability of the cell corresponds to the noise-margin of the inverter loop with the word-line being ACTIVE and the cell internal nodes being connected to the bit-lines. The read stability is usually worse than the intrinsic stability. Consequently, the power supply can drop to a far lower value than when the cell is read-out.

Powering down the supply can be accomplished by the use of "sleep switches" (or sleep devices) that are deactivated when cells are idled and activated when the cells are being written to or read from. To save the state of the memory array, the power supply of the SRAM arrays should not be allowed to collapse completely.

BRIEF DESCRIPTION OF THE DRAWINGS

The foregoing and a better understanding of the present invention will become apparent from the following detailed description of arrangements and example embodiments and the claims when read in connection with the accompanying drawings, all forming a part of the disclosure of the present invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
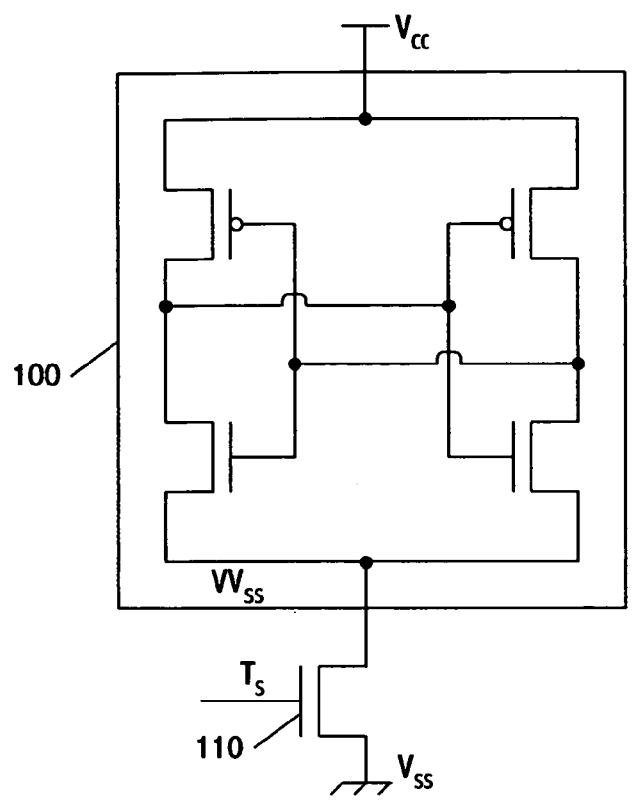
FIG. 1 illustrates a SRAM device having a sleep device according to an example arrangement.

In the following detailed description, reference is made to the accompanying drawings that show, by way of illustration, arrangements and specific embodiments in which the present invention may be practiced. In the drawings, like reference numerals describe substantially similar components throughout the several views. While signals or values may be described as HIGH/ON or LOW/OFF, these descriptions are intended to be relative to the discussed arrangement and/or embodiments. That is, a value may be described as HIGH/ON in one arrangement, although it may be LOW/OFF in another (e.g., complementary) arrangement as will be appreciated by those skilled in the art. The following description relates to IDLE and ACTIVE states. Other types of states are also within the scope of the present invention. Further, the terminology state may refer to an operation, mode, phase, etc. Additionally, the terminology state may also refer to a desired state of a component.

Embodiments of the present invention may include a SRAM memory array, a sleep device having at least one sleep transistor and a clamping circuit configured to activate the sleep device based on a voltage drop across the memory array and based on a state of the memory array. For example, the clamping circuit may activate the sleep device when a voltage drop across the memory array falls below a preset voltage when the memory array is in an IDLE state.

Figure 2:
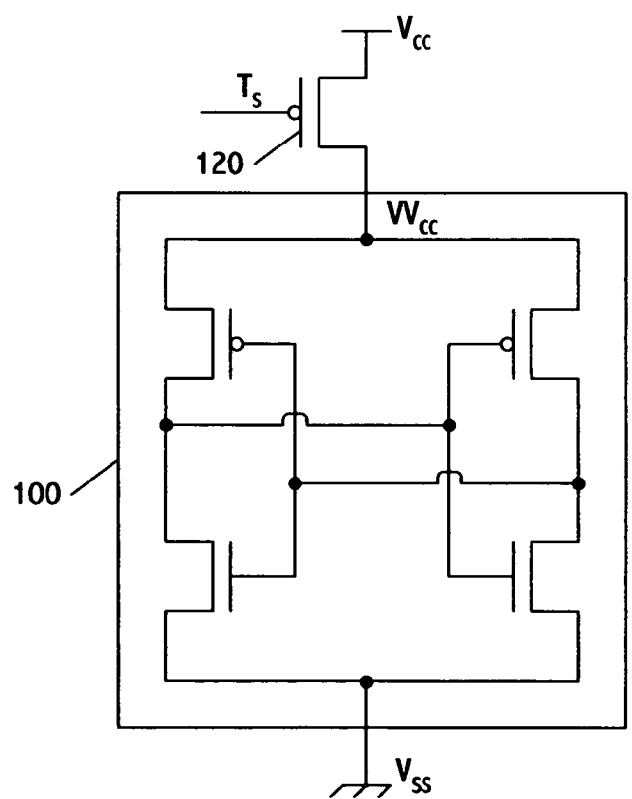
FIG. 2 illustrates a SRAM device having a sleep device according to an example arrangement.

FIG. 1 and FIG. 2 each illustrate an SRAM array having a sleep device (or sleep switches) according to example arrangements. Other arrangements are also possible. More specifically, FIGS. 1 and 2 both show an SRAM array 100. Configurations of the SRAM array 100 are well known to those skilled in the art and therefore will not be described in detail. These figures show two possibilities of placing sleep switches 110 and 120 (or sleep devices) with relation to the SRAM array 100. In FIG. 1, the sleep switch 110 is provided on the Vcc grid of the SRAM array 100. Alternatively, in FIG. 2 the sleep switch 120 is provided on the Vss grid of the SRAM array 100. The sleep switch (110 or 120) may be disabled (e.g., OFF) when the memory array is in an IDLE state and enabled (e.g., ON) when the memory array is in an ACTIVE state. The following description will relate to the sleep switch (or switches) being provided on the Vss grid of the SRAM array 100. However, those skilled in the art will appreciate that circuits in this description are also applicable to control a Vcc grid based sleep switch.

Leakage current of the SRAM array 100 may flow through the sleep switch 110 when the SRAM array 100 is IDLE (or in an IDLE state). The drop across the sleep switch (or transistor) 110 forces a virtual Vss grid (VVss) of the SRAM array 100 to increase. Consequently, the voltage across the SRAM array 100 drops and the leakage current through the SRAM array 100 is reduced. However, without any additional voltage control circuits, the voltage across the SRAM array 100 may collapse. This may result in a loss of data in the SRAM array 100.

Figure 3:
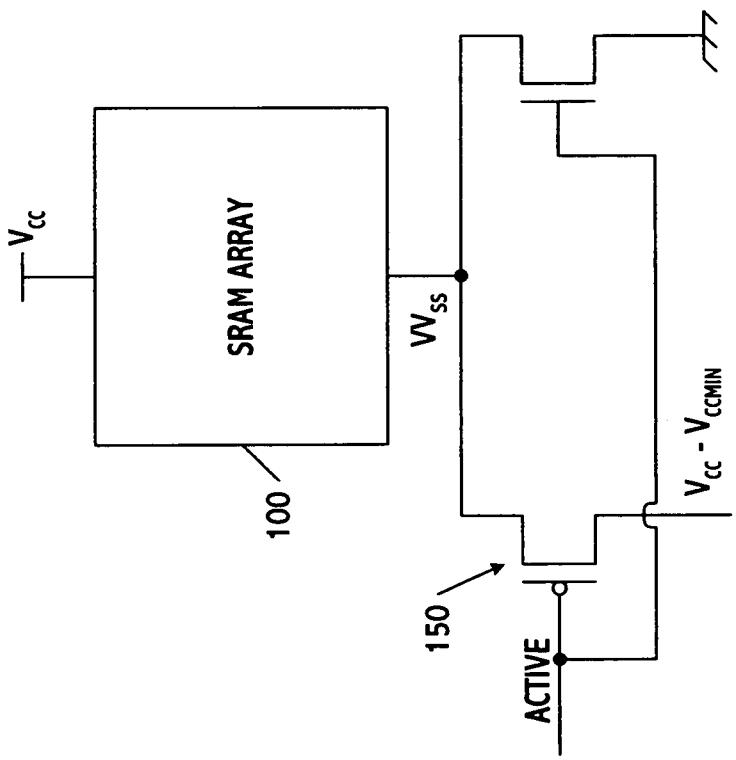
FIG. 3 illustrates a SRAM device coupled to an auxiliary power supply according to an example arrangement.

FIG. 3 illustrates a SRAM array connected to an auxiliary power supply according to an example arrangement. Other arrangements are also possible. More specifically, a circuit 150 (such as a transistor) may prevent the collapse of the voltage of the SRAM array 100 by connecting the array 100 to a fixed supply voltage (e.g., Vcc–Vccmin) when the SRAM array 100 is IDLE (or in an IDLE state). That is, as shown in FIG. 3, the circuit 150 connects the array 100 to the fixed supply voltage based on an ACTIVE signal (or the lack of the ACTIVE signal) at a gate of the transistor. However, this arrangement requires a separate supply line for Vcc–Vmin.

Figure 4:
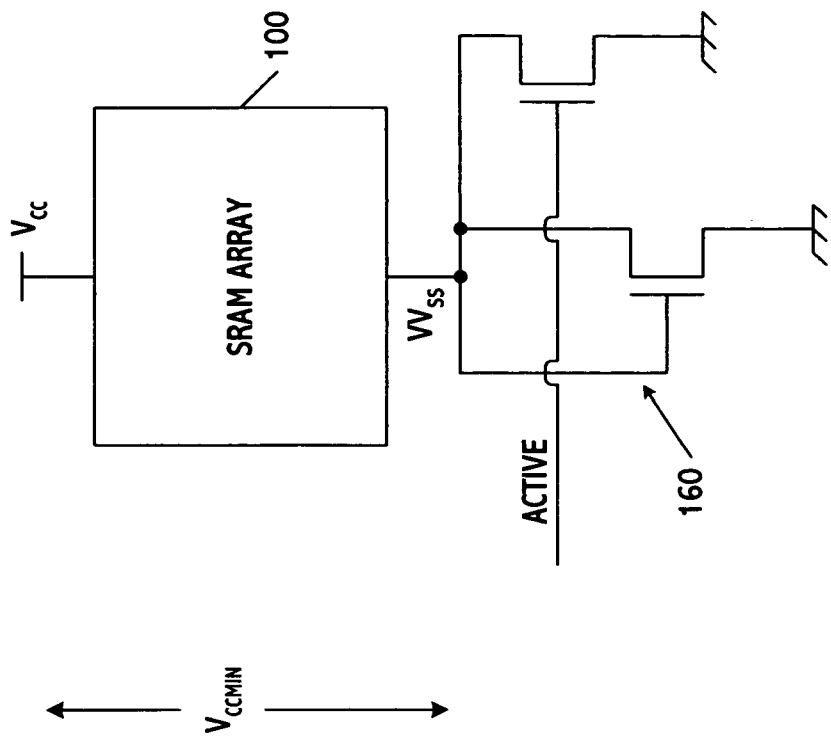
FIG. 4 illustrates a SRAM device coupled to a diode-connected device according to an example arrangement.

FIG. 4 illustrates a SRAM array connected to diode-connected transistor 160 according to an example arrangement. The diode-connected transistor 160 may limit the voltage drop across the memory array 100. However, this arrangement does not allow controllability on Vmin.

Embodiments of the present invention may include a clamping circuit to prevent a rise of VVss beyond a preset voltage. Therefore, the voltage (or voltage drop) across the SRAM array may not fall below a preset level (e.g., Vccmin). Maintaining a minimum voltage across the SRAM array may be achieved by turning ON a sleep device when the VVss grid rises above a preset voltage (e.g., Vcc–Vccmin). Additionally, to achieve maximum power savings the clamping circuit may keep the sleep device OFF for as long as the SRAM supply (i.e., voltage across the SRAM array) has not reached Vccmin. One skilled in the art would appreciate that the value of Vccmin may be dependent on the process used to fabricate the memory array, design of the memory array, and the like.

Figure 5:
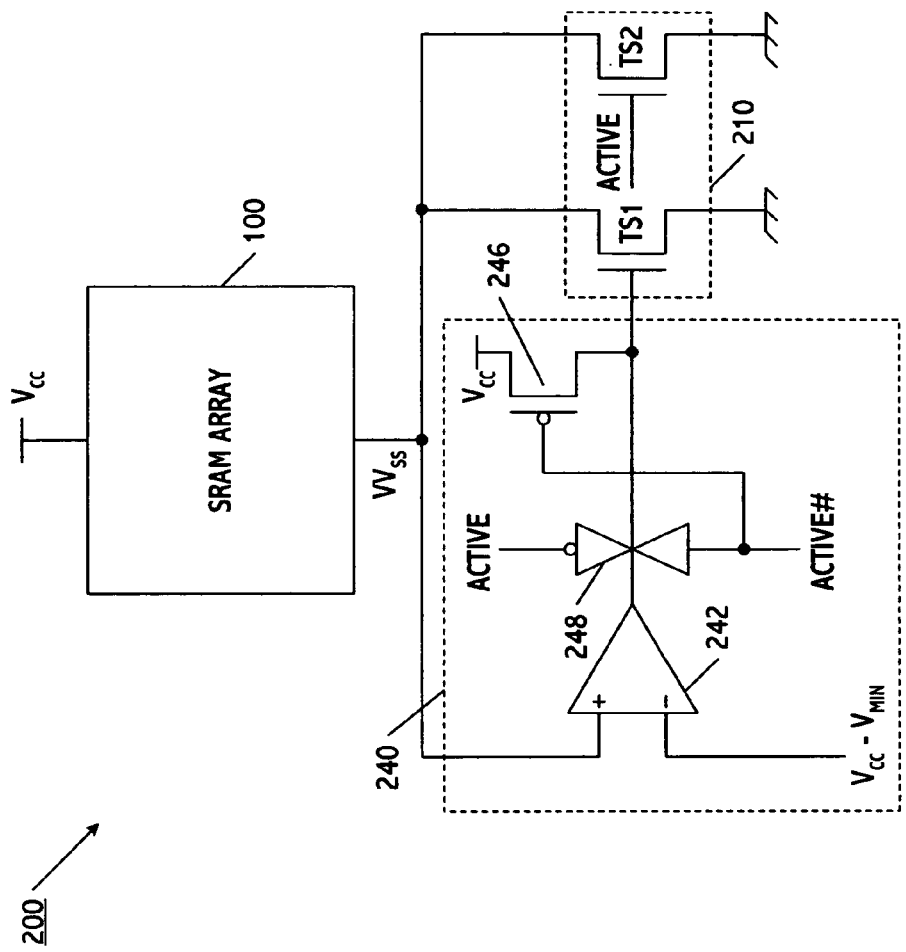
FIG. 5 illustrates a SRAM device according to an example embodiment of the present invention.

FIG. 5 is a circuit diagram of a SRAM device 200 according to an example embodiment of the present invention. Other embodiments and configurations are also within the scope of the present invention. More specifically, the SRAM device 200 includes the SRAM array 100, a sleep device 210 and a clamping circuit 240. The clamping circuit 240 may be a closed loop operational amplifier (op-amp) based circuit to clamp the VVss grid of the SRAM array 100. The sleep device 210 may include (or is sub-divided into) at least two components, namely a first sleep transistor Ts1 and a second sleep transistor Ts2. The second sleep transistor Ts2 may be turned OFF when the SRAM array 100 is in an IDLE state (or operation). The second sleep transistor Ts2 may be turned ON when the SRAM array 100 is in an ACTIVE state (or operation). The first sleep transistor Ts1 may be controlled by monitoring the VVss grid using an amplifier 242 (e.g., an operational-amplifier). When the VVss grid rises above the preset voltage (e.g., Vcc–Vccmin), the amplifier 242 turns ON the first sleep transistor Ts1 to the extent required to clamp the VVss grid to the preset voltage. That is, one input of the amplifier 242 is coupled to the VVss grid and the other input is coupled to the preset voltage (e.g. Vcc–Vccmin).

A transistor 246 may be coupled between a voltage source and a gate of the first sleep transistor Ts1. The transistor 246 may force the first sleep transistor TS1 ON when the memory array is ACTIVE (based on the ACTIVE# signal applied to a gate of the transistor 246). A transmission gate 248 may also be coupled to the output of the amplifier 242 and the gate of the first sleep transistor Ts1. The transmission gate 248 may receive an ACTIVE signal and an ACTIVE# signal as inputs to the transmission gate 248. The transmission gate 248 may decouple the output of the amplifier 242 from the first sleep transistor Ts1 when the SRAM array 100 is in an ACTIVE state (based on the ACTIVE signal, for example). The various signals ACTIVE and ACTIVE# indicating the respective state of the memory array 100 may be provided by a control device. The control device may further provide IDLE and IDLE # signals. These signals may indicate a particular state or a desired state of the memory array and/or other components.

In the illustrated embodiment, during an IDLE state (or sleep mode), the second sleep transistor Ts2 is OFF, the transistor 246 is OFF, the transmission gate 248 is ON and the gate voltage of the first sleep transistor Ts1 is determined by the output of the amplifier 242. On the other hand, during the ACTIVE state, the first sleep transistor TS1, the second sleep transistor Ts2, and the transistor 246 are ON, and the transmission gate 248 is OFF.

More specifically, upon activation, both the first sleep transistor Ts1 and the second sleep transistor Ts2 are turned ON. In the IDLE state, the second sleep transistor Ts2 is OFF and the voltage at the first sleep transistor Ts1 is determined by the unity-gain closed loop configuration. The amplifier 242 ensures that the gate voltage of the first sleep transistor Ts1 is such that VVss=Vcc–Vmin. When initially entering into the IDLE state, the amplifier 242 significantly reduces the gate voltage of the first sleep transistor Ts1 from Vcc (>90%) to allow faster ramping on VVss. This may allow very fast leakage savings. The final voltage on the gate of the first sleep transistor Ts1 may be determined by the amplifier 242 to ensure these conditions.

The second sleep transistor Ts2 may be much larger than the first sleep transistor Ts1 since the second sleep transistor Ts2 will have to sink all active current when the memory array is ACTIVE. The first sleep transistor Ts1 may be used as a clamp that sinks leakage current, so it may not be as large as the second sleep transistor Ts2.

Figure 6:
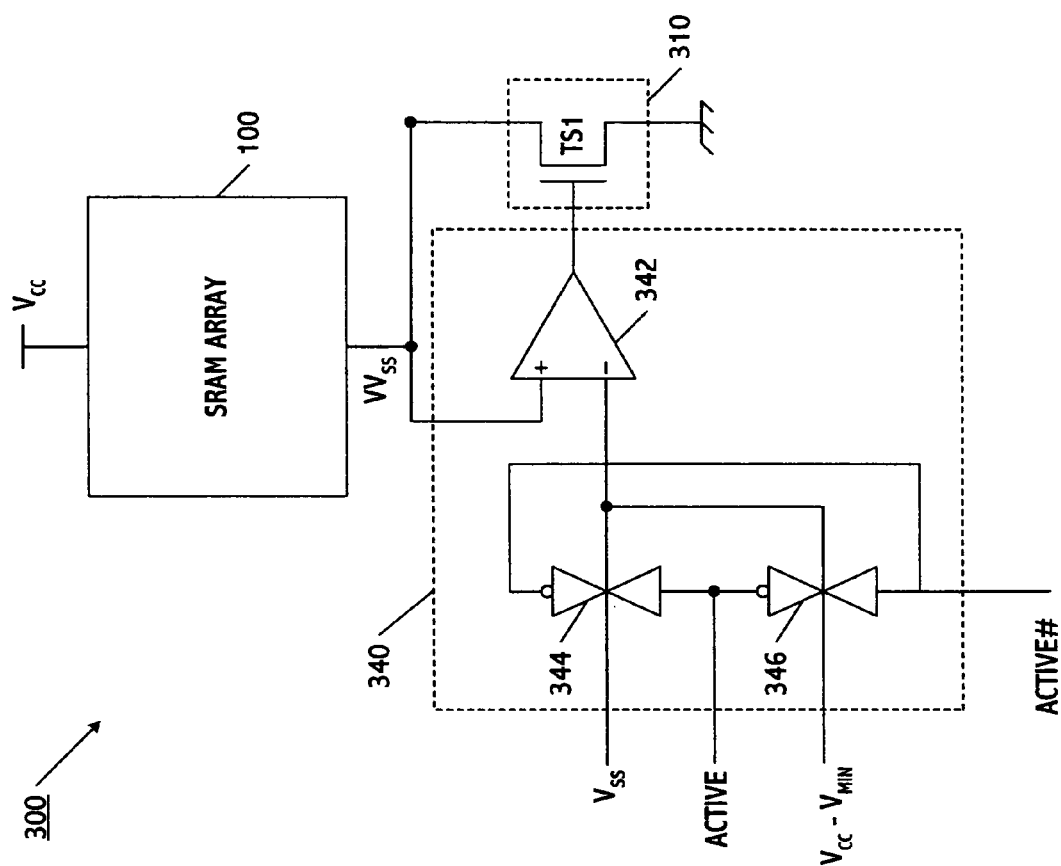
FIG. 6 illustrates a SRAM device according to an example embodiment of the present invention.

FIG. 6 is a circuit diagram of a SRAM device 300 according to an example embodiment of the present invention. Other embodiments and configurations are also within the scope of the present invention. More specifically, the SRAM device 300 includes the SRAM array 100, a sleep device 310 and a clamping circuit 340. The sleep device 310 may include a first sleep transistor Ts1. The clamping circuit 340 may include an amplifier 342, a first transmission gate 344 and a second transmission gate 346. In this embodiment, the ACTIVE state is accomplished by turning ON the first sleep transistor Ts1. The sleep transistor Ts1 is turned OFF when the SRAM array 100 is IDLE. However, once the VVss grid rises above the preset voltage, the amplifier 342 turns ON the first sleep transistor Ts1 to the extent required to clamp the VVss grid to the preset voltage (e.g. Vcc–Vmin). In the illustrated embodiment, the transmission gates 344 and 346 operate to control the reference voltage input to the amplifier 342. When the SRAM array 100 is in an ACTIVE state, the transmission gate 344 is ON and the transmission gate 346 is OFF. Accordingly, VSS is coupled to an input of the amplifier 342 and the sleep transistor Ts1 is turned ON. When the SRAM array 100 is in an IDLE state (or sleep state), the transmission gate 344 is OFF and the transmission gate 346 is ON. Accordingly, a reference voltage (e.g., Vcc–Vmin) is coupled to an input of the amplifier 342 and the first sleep transistor Ts1 is regulated based on the feedback of VVss. That is, the first sleep transistor TS1 is used to prevent VVss from exceeding Vcc–Vmin. The various signals ACTIVE and ACTIVE# indicating the respective state of the memory array may be provided by a control device. The control device may further provide IDLE and IDLE # signals. These signals may indicate a particular state or a desired state of the memory array and/or other components.

In FIG. 5, dividing the sleep device 210 into separate devices (e.g., such as the first sleep transistor Ts1 and the second sleep transistor Ts2) may reduce the load being driven by the amplifier 242. For example, the amplifier 242 can be configured to drive only the first sleep transistor Ts1. In this case, and upon wake-up (i.e., activation), the output of the amplifier 242 should be Vcc. Additionally, at the beginning of the IDLE phase or if the leakage current from the SRAM array 100 is small, the sleep device 210 (both Ts1 and Ts2) is almost completely shut-off. In FIG. 5, by reducing the size of the first sleep transistor Ts1, the voltage at the gate of the first sleep transistor Ts1 can be higher than GROUND during IDLE and therefore doesn't require an amplifier 242 with a rail-to-rail output (e.g., supply voltage to ground). On the other hand, in FIG. 6, the first sleep transistor Ts1 may be completely turned OFF at the beginning of the IDLE phase. Accordingly, the voltage on the gate of the first sleep transistor should be close to GROUND. The amplifier 342 therefore drives its output very close to GROUND (i.e., <10 mv).

Embodiments of the present invention may include an apparatus that includes a memory array, a sleep device, and a clamp circuit. The clamp circuit may be configured to activate the sleep device when a voltage drop across (e.g., Vcc–VVss) the memory array falls below a preset voltage (e.g., Vccmin) and when the memory array (or the memory device) is in an IDLE state. Those skilled in the art will appreciate that the memory array can be an SRAM array, 6T SRAM, multi-part SRAMs and the like. That is, embodiments of the present invention are applicable to different types of SRAM memories.

The sleep device may include a first sleep transistor coupled to the memory array. The clamping circuit may be configured to activate the first sleep transistor when the voltage drop across the memory array falls below the preset voltage. Accordingly, the voltage drop across the memory array may be maintained at the preset voltage, which can be a minimum voltage (Vccmin) for maintaining the state of the memory array.

The sleep device may also include a second sleep transistor coupled to the memory array. The second sleep transistor may be configured to be activated (e.g., turned ON) when the memory array is in an ACTIVE state and deactivated (e.g., turned OFF) when the memory array is in an IDLE state.

The clamping circuit may include an amplifier (e.g., an op-amp) having a first input (e.g., +input) coupled to a node VVss between the sleep device and the memory array and a second input (e.g., –input) coupled to the reference voltage (e.g., Vcc–Vccmin). The clamping circuit may further include an output coupled to the sleep device. The clamping circuit may also include a transistor coupled to the output of the amplifier. The transistor may turn ON the first sleep transistor when the SRAM array is in an ACTIVE state.

Embodiments of the present invention may include methods of performing the functions discussed in the foregoing description. For example, an embodiment of the present invention may include a method for maintaining a voltage in a memory device. The method may include determining a voltage across the memory array; and activating a sleep device when the voltage drop across the memory array falls below a preset voltage and the memory array is in an IDLE state.

Figure 7:
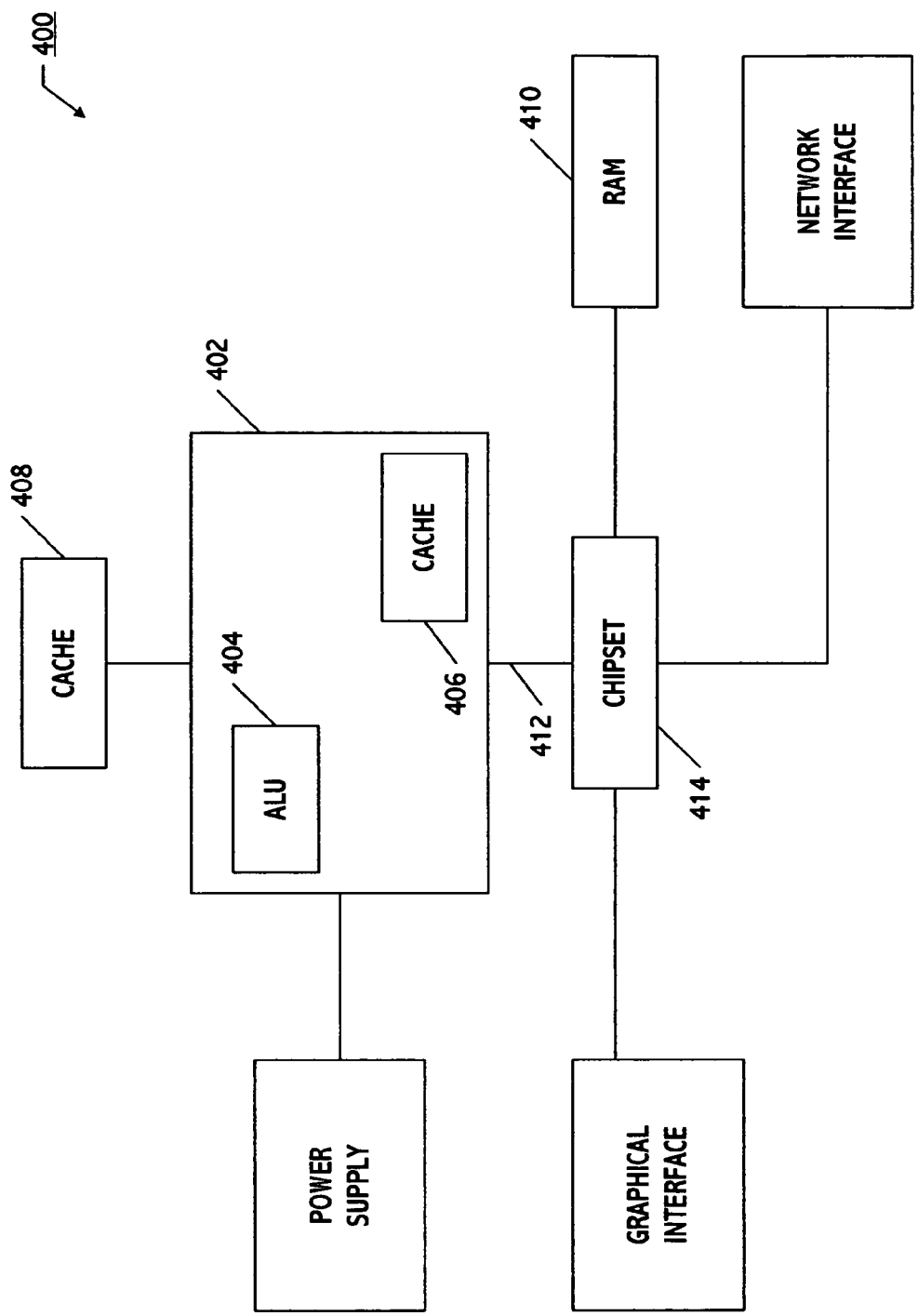
FIG. 7 is a system level block diagram of a computer system according to an example embodiment of the present invention.

Embodiments of the present invention may be used in a wide variety of applications including computer systems. FIG. 7 is a block diagram of a computer system having a SRAM device according to an example embodiment of the present invention. Other embodiments, configurations and systems are also within the scope of the present invention. As one example, the computer system 400 may include a processor 402 and other components, which can include aspects of the foregoing embodiments and constitutes embodiments of the present invention. The processor 402 can include many sub-blocks such as an arithmetic logic unit (ALU) 404 and an on-die cache 406. The processor 402 may also communicate to other levels of cache, such as off-die cache 408. Higher memory hierarchy levels such as system memory (RAM) 410 may be accessed via host bus 412 and a chip set 414. In addition, other off-die functional units such as a graphics interface and a network interface, to name just a few, may communicate with the processor 402 via appropriate busses or ports. For example, the system memory 410, the off-die cache memory 408, and/or the on-die cache memory 406 may include memory arrays according to embodiments of the present invention.

Systems represented by the various foregoing figures can be of any type. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Embodiments of the present invention may be described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. Accordingly, the detailed description is not to be taken in a limiting sense.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art

What is claimed is:

1. An apparatus comprising:
   a memory array;
   a sleep device coupled to the memory array; and a clamping circuit coupled to the sleep device, the clamping circuit to activate the sleep device based on a voltage drop across the memory array and a state of the memory array.

2. The apparatus of claim 1, wherein the clamping circuit activates the sleep device when a voltage drop across the memory array falls below a preset voltage and the memory array is in an IDLE state.

3. The apparatus of claim 2, wherein the sleep device comprises a first transistor.

4. The apparatus of claim 3, wherein the clamping circuit activates the first transistor when the voltage drop across the memory array falls below a preset voltage.

5. The apparatus of claim 3, wherein the sleep device further comprises a second transistor.

6. The apparatus of claim 5, further comprising a control device to provide a signal indicating a state of the memory array.

7. The apparatus of claim 6, wherein the control device activates the second transistor when the memory array is to be in an ACTIVE state and deactivates the second transistor when the memory array is to be in an IDLE state.

8. The apparatus of claim 3, wherein the clamping circuit comprises:
an amplifier having a first input, a second input and an output, the first output coupled to a node between the sleep device and the memory array, the second input coupled to a reference voltage, and the output coupled to a gate of the first transistor.

9. The apparatus of claim 8, wherein the clamping circuit further comprises:
a transistor coupled to the output of the amplifier, the transistor to activate the first transistor when the memory array is in an ACTIVE state.

10. The apparatus of claim 8, wherein the reference voltage comprises a supply voltage minus the preset voltage.

11. The apparatus of claim 8, wherein the clamping circuit further comprises:
a transmission gate coupled between the output of the amplifier and a gate of the first transistor, the transmission gate to couple the output of the amplifier to the gate of the first transistor when the memory array is to be in an ACTIYE state and to decouple the output of the amplifier from the gate to the first transistor when the memory array is to be in an IDLE state.

12. The apparatus of claim 8, wherein the clamping circuit further comprises:
a first transmission gate and a second transmission gate configured to provide a first input signal to the second input of the amplifier as the reference voltage when the memory array is to be in an ACTIVE state and to provide a second input signal to the second input of the amplifier as the reference voltage when the memory array is to be in an IDLE state.

13. The apparatus of claim 12, wherein the second input signal corresponds to a supply voltage minus the preset voltage.

14. The apparatus of claim 2, wherein the voltage drop across the memory array is maintained at the preset voltage.

15. The apparatus of claim 2, wherein the preset voltage is a minimum voltage for maintaining a state of the memory array.

16. The apparatus of claim 1, wherein the memory array comprises a static random access memory (SRAM) array.

17. A memory device comprising:
a memory array;
a sleep device coupled to the memory array; and
a clamping device coupled to the sleep device, the clamping device to control the sleep device based on a state of the memory array and a voltage level of a node coupled to the memory array.

18. The memory device of claim 17, wherein the clamping device activates the sleep device when the voltage level of the node is below a preset voltage and based on the memory array being in an IDLE state.

19. The memory device of claim 17, wherein the sleep device comprises a first sleeping transistor.

20. The memory device of claim 19, wherein the clamping device comprises an amplifier, an output of the amplifier coupled to a gate of the sleeping transistor.

21. The memory device of claim 20, wherein the clamping device turns ON the first sleeping transistor when a voltage drop across the memory array is below a preset voltage.

22. The memory device of claim 19, wherein the sleep device comprises a second sleeping transistor.

23. The memory device of claim 19, wherein the clamping circuit comprises:
an amplifier having a first input, a second input and an output, the first output coupled to a node between the sleep device and the memory array, the second input coupled to a reference voltage, and the output coupled to a gate of the first transistor.

24. The memory device of claim 23, wherein the clamping circuit further comprises:
a transistor coupled to the output of the amplifier, the transistor to activate the first sleeping transistor based on the memory array being active.

25. The memory device of claim 23, wherein the clamping circuit further comprises:
a transmission gate coupled between the output of the amplifier and a gate of the first sleeping transistor, the transmission gate to couple the output of the amplifier to the gate of the first sleeping transistor based on the memory array being active, and the transmission gate to decouple the output of the amplifier from the gate to the first transistor based on the memory array being idle.

26. The memory device of claim 23, wherein the clamping circuit further comprises:
a first transmission gate and a second transmission gate configured to provide a first input signal to the second input of the amplifier as the reference voltage based on the memory array being active and to provide a second input signal to the second input of the amplifier as the reference voltage based on the memory array being idle.

27. The memory device of claim 17, wherein the memory array comprises a static random access memory array.

28. A method comprising:
monitoring a voltage drop across a memory array; and
activating a sleep device based on the voltage drop across the memory array and based on a state of the memory array.

29. The method of claim 28, wherein the memory array comprises a static random access memory (SRAM) array.

30. The method of claim 28, wherein the sleep device is activated when the voltage drop across the memory array falls below a preset voltage and the memory array is to be in an IDLE state.

31. The method of claim 28, wherein activating the sleep device comprises a clamping device turning on a sleeping transistor of the sleep device.

32. The apparatus of claim 1, wherein the memory array is coupled between a supply voltage and a node between the memory array and the sleep device.

33. The apparatus of claim 32, wherein the voltage drop corresponds to a voltage difference between the supply voltage and a voltage at the node.

34. The apparatus of claim 33, wherein the clamping circuit includes an amplifier having a first input and a second input, the first input corresponding to the voltage at the node.

35. The apparatus of claim 34, wherein an output of the amplifier is indicative of the voltage drop.

36. The memory device of claim 17, wherein the clamping device includes an amplifier having a first input and a second input, the first input corresponding to the node.

37. The memory device of claim 17, wherein the clamping device to control the sleep device based on a voltage drop across the memory array.

38. The memory device of claim 17, wherein the clamping device activates the sleep device when the voltage level of the node falls below a preset voltage and the memory array is in an IDLE state.

39. A system comprising:
   a die having an on-die memory; and
   an off-die memory, one of the on-die memory and the off-die memory including:
      a memory array;
      a sleep device coupled to the memory array; and
      a clamping circuit including an amplifier having a first input, a second input and an output, the first output coupled to a node between the sleep device and the memory array, the second input coupled to a reference voltage, the clamping circuit to control the sleep device based on a voltage at the node between the sleep device and the memory array and based on a state of the memory array.

40. The system of claim 39, wherein the clamping circuit activates the sleep device when a voltage drop across the memory array falls below a preset voltage and the memory array is in an IDLE state.

41. The system of claim 39, wherein the clamping circuit further includes:
   a transmission gate coupled between the output of the amplifier and a gate of a transistor of the sleep device, the transmission gate to couple the output of the amplifier to the gate of the transistor when the memory array is to be in an ACTIVE state and to decouple the output of the amplifier from the gate to the transistor when the memory array is to be in an IDLE state.

42. The system of claim 39, wherein the clamping circuit further includes:
   a first transmission gate and a second transmission gate configured to provide a first input signal to the second input of the amplifier as the reference voltage when the memory array is to be in an ACTIVE state and to provide a second input signal to the second input of the amplifier as the reference voltage when the memory array is to be in an IDLE state.

* * * * *